United States Patent
Clark et al.

(10) Patent No.: US 7,772,073 B2
(45) Date of Patent: Aug. 10, 2010

(54) SEMICONDUCTOR DEVICE CONTAINING A BURIED THRESHOLD VOLTAGE ADJUSTMENT LAYER AND METHOD OF FORMING

(75) Inventors: Robert D. Clark, Schenectady, NY (US); Gerrit J. Leusink, Saltpoint, NY (US)

(73) Assignee: Tokyo Electron Limited, Tokyo (JP)

( * ) Notice: Subject to any disclaimer, the term of this patent is extended or adjusted under 35 U.S.C. 154(b) by 25 days.

(21) Appl. No.: 11/864,514

(22) Filed: Sep. 28, 2007

(65) Prior Publication Data

US 2009/0085175 A1    Apr. 2, 2009

(51) Int. Cl.
*H01L 21/336* (2006.01)

(52) U.S. Cl. ............ 438/287; 438/216; 438/591; 438/785; 257/E21.625; 257/E21.639

(58) Field of Classification Search .......... 438/612, 438/287, 585, 591, 763, 785, FOR. 202, FOR. 395, 438/FOR. 489, 216, 597; 257/E21.625, E21.639
See application file for complete search history.

(56) References Cited

U.S. PATENT DOCUMENTS

| | | | |
|---|---|---|---|
| 6,407,435 B1 * | 6/2002 | Ma et al. | 257/411 |
| 6,617,639 B1 * | 9/2003 | Wang et al. | 257/324 |
| 6,642,131 B2 * | 11/2003 | Harada | 438/591 |
| 7,091,568 B2 | 8/2006 | Hegde et al. | |
| 7,446,380 B2 | 11/2008 | Bojarczuk et al. | |
| 7,507,652 B2 * | 3/2009 | Cho et al. | 438/591 |
| 2002/0172768 A1 * | 11/2002 | Endo et al. | 427/255.28 |
| 2006/0054943 A1 * | 3/2006 | Li et al. | 257/266 |
| 2006/0151823 A1 | 7/2006 | Govindarajan | |
| 2006/0189154 A1 | 8/2006 | Ahn et al. | |
| 2006/0289948 A1 | 12/2006 | Brown et al. | |
| 2007/0237697 A1 | 10/2007 | Clark | |
| 2008/0081113 A1 | 4/2008 | Clark | |
| 2009/0047798 A1 | 2/2009 | Clark et al. | |

OTHER PUBLICATIONS

Xinyuan Zhao, et al., "First-Principles Study of Electronic and Dielectric Properties of $ZrO_2$ and $HfO_2$", Mat. Res. Soc. Symp. Proc. vol. 745 © 2003 Materials Research Society, pp. 283-289.

Karaulov, A. G., et al., "Preparation and Use of Articles From Monoclinic Zirconium-Hafnium Solid Solutions of Oxides" (1 page, abstract only).

(Continued)

*Primary Examiner*—Matthew Smith
*Assistant Examiner*—Quovaunda Jefferson
(74) *Attorney, Agent, or Firm*—Oblon, Spivak, McClelland, Maier & Neustadt, L.L.P.

(57) ABSTRACT

A method is provided for forming a semiconductor device containing a buried threshold voltage adjustment layer. The method includes providing a substrate containing an interface layer, depositing a first high-k film on the interface layer, depositing a threshold voltage adjustment layer on the first high-k film, and depositing a second high-k film on the threshold voltage adjustment layer such that the threshold voltage adjustment layer is interposed between the first and second high-k films. The semiconductor device containing a patterned gate stack is described.

3 Claims, 7 Drawing Sheets

OTHER PUBLICATIONS

R. I. Hegde, et al., "Microstructure Modified $HfO_2$ Using Zr Addition With $TA_xC_y$ Gate for Improved Device Performance and Reliability", IEEE, 2005, (4 pages).

C. Zhao, et al., "Crystallization and Tetragonal-Monoclinic Transformation in $ZrO_2$ and $HfO_2$ Dielectric Thin Films", Key Engineering Materials vols. 206-213 (2002), pp. 1285-1288.

Y. Kuo, et al., "Sub 2 NM Thick Zirconium Doped Hafnium Oxide High-K Gate Dielectrics", ECS Transactions, The Electrochemical Society, 2006, pp. 447-454.

Kyoung-Ryul Yoon, et al., "Performance and Reliability of MIM (Metal-Insulator-Metal Capacitors With $ZrO_2$ for 50nm DRAM Application", Extended Abstracts of the 2005 International Conference on Solid State Devices and Materials, Kobe, 2005, pp. 188-189.

Hyoungsub Kim, et al., "Comparative Study on Electrical and Microstructural Characteristics of $ZrO_2$ and $HfO_2$ Grown by Atomic Layer Deposition", J. Mater. Res., vol. 20, No. 11, Nov. 2005, © Material Research Society, pp. 3125-3132.

Y. Kuo, et al., "Sub 2 nm Thick Zirconium Doped Hafnium Oxide High-K Gate Dielectrics", Thin Film Nano & Microelectronics Research Laboratory (1 page).

Tsunehiro Ino, et al., "Dielectric Constant Behavior of Oriented Tetragonal Zr-Si-O System", Extended Abstracts of the 2006 International Conference on Solid State Devices and Materials, Yokohama 2006, pp. 404-405.

Xinyuan Zhao, et al., "Phonons and Lattice Dielectric Properties of Zirconia", Physical Review B. vol. 65, pp. 075105-1-075105-10.

G. M. Rignanese, et al., "First-Principles Investigation of High-$K$ Dielectrics: Comparison Between the Silicates and Oxides of Hafnium and Zirconium", Physical Review B 69, 2004, pp. 184301-1-184301-10.

H. Y. Yu, et al., "Physical and Electrical Characteristics of HfN Gate Electrode for Advanced MOS Devices", IEEE Electron Device Letters, vol. 24, No. 4, Apr. 2003, pp. 230-232.

Kamimuta et al., "Systematic Study of Vfb Shift in Stacked High-k Bi-layers with Cycle-by-Cycle ALD", Abstract, $7^{th}$ International Conference on Atomic Layer Deposition, Jun. 24-27, 2007, San Diego, CA (1 pp).

Kamimuta et al., "Systematic Study of Vfb Shift in Stacked High-k Bi-layers with Cycle-by-Cycle ALD" Presentation at the ALD 2007 Conference, Jun. 27, 2007 (18 pp).

* cited by examiner

SEMICONDUCTOR DEVICE CONTAINING A BURIED THRESHOLD VOLTAGE ADJUSTMENT LAYER AND METHOD OF FORMING

CROSS-REFERENCE TO RELATED APPLICATIONS

This application is related to co-pending U.S. patent application Ser. No. 11/688,675, entitled "METHOD OF FORMING CRYSTALLOGRAPHICALLY STABILIZED DOPED HAFNIUM ZIRCONIUM BASED MATERIALS," filed on Mar. 20, 2007, and co-pending U.S. patent application Ser. No. 11/688,643, entitled "SEMICONDUCTOR DEVICE CONTAINING CRYSTALLOGRAPHICALLY STABILIZED DOPED HAFNIUM ZIRCONIUM BASED MATERIALS," filed on Mar. 20, 2007. The entire contents of each of these applications are hereby incorporated by reference.

FIELD OF INVENTION

The present invention relates to semiconductor devices containing patterned gate stacks with high dielectric constant (high-k) materials, and more particularly to integration of threshold voltage adjustment layers into the semiconductor devices.

BACKGROUND OF THE INVENTION

Recent advances in microelectronics have included the use of high-k films in gate stacks for logic applications. These high-k films often include hafnium (Hf) and/or zirconium (Zr) based oxides/silicates that are deposited on a Si substrate. In addition, advanced gate stacks may include metal gate electrodes that are deposited on the high-k films. The chemical composition of the metal gate electrodes is selected to have the appropriate work functions for N-MOS and P-MOS transistors. While metal gate electrode layers do not need to be doped to be electrically conductive, there is not one metal that can set the appropriate work function for both NMOS and PMOS devices; the energy required to pull an electron free from the surface of the electrode.

One approach for controlling the gate electrode work function includes depositing a composite metal-containing gate electrode layer, where composition of the layer can be adjusted to obtain the desired workfunction of the gate electrode. However, the effective workfunction of a gate stack further depends on bulk and surface material properties, crystallographic orientation, and the permittivity of the high-k film interfacing with the gate electrode layer. In particular, interactions of the different materials at layer interfaces and diffusion of chemical species throughout a gate stack during post-processing can affect the work function and other properties of the semiconductor device. Thus, methods for controlling the gate electrode work function by controlling composition of the gate electrode layer may be ineffective in achieving the desired work function, and new methods are needed for adjusting and controlling the effective work function of semiconductor devices containing high-k materials.

SUMMARY OF THE INVENTION

A semiconductor device containing a buried threshold voltage adjustment layer and method for forming are disclosed in various embodiments. The buried threshold voltage adjustment layer may be utilized to control the work function of gate stacks and to obtain the desired threshold voltages for N-MOS and P-MOS transistors in a manufactured semiconductor device.

According to one embodiment of the invention, the method includes providing a substrate containing an interface layer, depositing a first high-k film on the interface layer, depositing a threshold voltage adjustment layer on the first high-k film, and depositing a second high-k film on the threshold voltage adjustment layer. The threshold voltage adjustment layer is interposed between the first and second high-k films.

According to another embodiment of the invention, a semiconductor device containing a patterned gate stack in described. The semiconductor devices contains a substrate having an interface layer thereon, a patterned first high-k film on the interface layer, a patterned threshold voltage adjustment layer on the first high-k film, a patterned second high-k film on the threshold voltage adjustment layer, and a patterned gate electrode on the patterned second high-k film. The patterned threshold voltage adjustment layer is interposed between the patterned first and second high-k films.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1A:
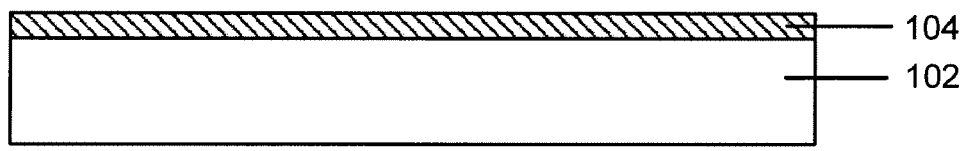
FIGS. 1A-1G schematically show cross-sectional views of forming a semiconductor device containing a buried threshold voltage adjustment layer according to an embodiment of the invention.

A semiconductor device containing a buried threshold voltage adjustment layer and method for forming are disclosed in various embodiments. Recently, gate electrode metals and dielectric threshold voltage adjustment layers have been utilized to control the work function of gate stacks and to obtain the desired threshold voltages for N-MOS and P-MOS transistors in a manufactured semiconductor device. Exemplary threshold voltage adjustment layers include lanthanum oxide ($La_2O_3$) for N-MOS devices and aluminum oxide ($Al_2O_3$) for P-MOS devices. The threshold voltage adjustment layers have generally been positioned above the high-k gate dielectric and in contact with the gate electrode. It has been shown that during high temperature processing, elements in the threshold voltage adjustment layers generally diffuse through the high-k gate dielectric towards an interface layer (e.g., a high mobility, low defect $SiO_2$ layer) positioned between the high-k gate dielectric and the substrate to cause threshold voltage adjustment near the interface of the high-k gate dielectric and the underlying interface layer.

One drawback to positioning the threshold voltage adjustment layer above the high-k material and in contact with the gate electrode is that the threshold voltage adjustment layer needs to be thick enough that is does not become depleted by diffusion through the underlying high-k material during heat-treating of the semiconductor device. Furthermore, because the threshold voltage adjustment layer is a dielectric layer, it can significantly add to the equivalent oxide thickness (EOT) of the gate stack. Another drawback is that a high temperature heat-treating is required in order for the element(s) of the threshold voltage adjustment layer to diffuse through the high-k gate dielectric towards the interface layer. However, element(s) of some threshold voltage adjustment layers may not sufficiently diffuse through the high-k gate dielectric to fully adjust the threshold voltage of the semiconductor device to the desired value.

A logical approach to addressing the above problems is to position the threshold voltage adjust layer at the interface of the high-k gate dielectric and the interface layer. This would allow adjustment and control of the threshold voltage and reduces or eliminates the need for high temperature heat-treating, in addition to minimizing the thickness needed for the threshold voltage adjustment layer in order to obtain the required threshold voltage shift. However, the present inventors determined that this approach results in a high defect interface between the threshold voltage adjustment layer and the underlying interface layer, leading to low carrier mobility for the semiconductor device. This effect renders the device unusable for practical applications.

Therefore, the present inventors discovered that there is a general need for new methods and approaches for obtaining the desired threshold voltages for semiconductor devices, while minimizing the drawbacks noted above. Embodiments of the invention provide methods for forming a semiconductor device containing a buried threshold voltage adjustment layer and semiconductor devices containing such a layer. According to one embodiment of the invention, the method includes providing a substrate containing a interface layer, depositing a first high-k film on the interface layer, depositing a threshold voltage adjustment layer on the first high-k film, and depositing a second high-k film on the threshold voltage adjustment layer. The method further includes depositing a gate electrode, performing a gate stack patterning process, and heat-treating the gate stack to adjust and control the threshold voltage of the semiconductor device containing the gate stack.

One skilled in the relevant art will recognize that the various embodiments may be practiced without one or more of the specific details described herein, or with other replacement and/or additional methods, materials, or components. In other instances, well-known structures, materials, or operations are not shown or described in detail herein to avoid obscuring aspects of various embodiments of the invention. Similarly, for purposes of explanation, specific numbers, materials, and configurations are set forth herein in order to provide a thorough understanding of the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention.

FIGS. 1A-1G schematically show cross-sectional views of forming a semiconductor device containing a buried threshold voltage adjustment layer according to an embodiment of the invention. FIG. 1A schematically shows a substrate 102 containing an interface layer 104. The substrate 102 can be of any size, for example a 200 mm substrate, a 300 mm substrate, or an even larger substrate. According to one embodiment, the substrate 102 can contain Si, for example crystalline Si, polycrystalline Si, or amorphous Si. In one example, the substrate 102 can be a tensile-strained Si layer. According to another embodiment, the substrate 102 may contain Ge or $Si_xGe_{1-x}$ compounds, where x is the atomic fraction of Si, 1-x is the atomic fraction of Ge, and $0<1-x<1$. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 102 can be a compressive-strained Ge layer or a tensile-strained $Si_xGe_{1-x}(x>0.5)$ deposited on a relaxed $Si_{0.5}Ge_{0.5}$ buffer layer. The interface layer 104 can, for example, contain high mobility, low defect $SiO_2$. The interface layer 104 can have a thickness between about 5 and about 15 angstrom, for example about 8 angstrom.

Figure 1B:
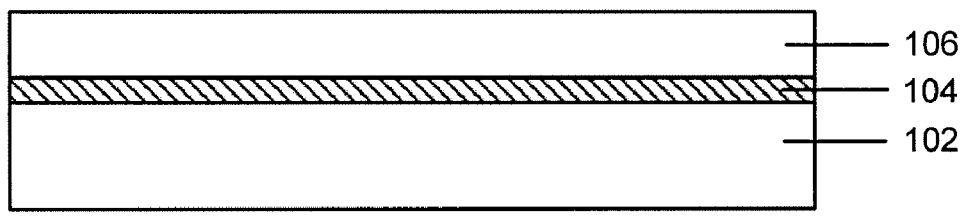

FIG. 1B schematically shows a first high-k film 106 deposited on the interface layer 104. The first high-k film 106 can contain hafnium, zirconium, or hafnium and zirconium, including hafnium oxide ($HfO_2$), hafnium oxynitride (HfON), hafnium silicate (HfSiO), hafnium silicon oxynitride (HfSiON), zirconium oxide ($ZrO_2$), zirconium oxynitride (ZrON), zirconium silicate (ZrSiO), zirconium silicon oxynitride (ZrSiON), hafnium zirconium oxide ($HfZrO_2$), hafnium zirconium oxynitride (HfZrON), hafnium zirconium silicate (HfZrSiO), hafnium zirconium silicon oxynitride (HfZrSiON), or a combination of two or more thereof. A thickness of the first high-k film 106 can, for example, be at least 2 angstrom, between about 2 angstrom and about 30 angstrom, or between about 5 angstrom and about 15 angstrom.

Figure 1C:
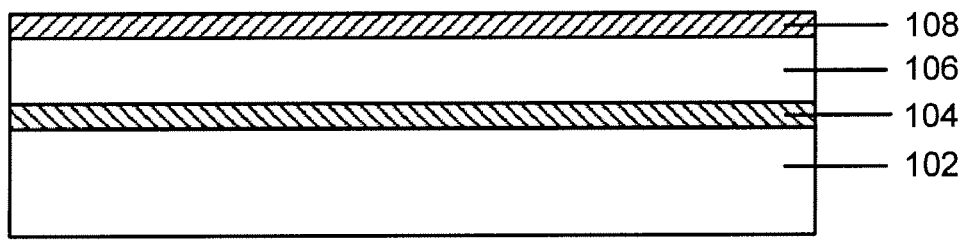

FIG. 1C schematically shows a threshold voltage adjustment layer 108 deposited on the first high-k film 106. The threshold voltage adjustment layer 108 can contain an oxide, oxynitride, or titanate layer containing one or more elements selected from Group II (beryllium (Be), magnesium (Mg), calcium (Ca), strontium (Sr), and barium (Ba)), Group III (scandium (Sc)), Group XIII (boron (B), aluminum (Al), gallium (Ga), indium (In), and thallium (Tl)), rare earth metals of the Periodic Table of the Elements, or a combination of two or more thereof. Exemplary rare earth elements include yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). Examples of rare earth metal oxides include lanthanium oxide ($La_2O_3$) and lutetium oxide ($Lu_2O_3$). Examples of titanate layer include barium titanate ($BaTiO_3$), strontium titanate ($SrTiO_3$), and barium strontium titanate ($BaSrTiO_3$). According to embodiments of the invention, the threshold voltage adjustment layer 108 can further contain hafnium, zirconium, or hafnium and zirconium. A thickness of the threshold voltage adjustment layer 108 can, for example, be between about 2 angstrom and about 30 angstrom, or between about 3 angstrom and about 10 angstrom. A lower limit of a thickness of the threshold voltage adjustment layer 108 may be determined based on a minimum thickness that yields a desired threshold voltage.

According to embodiments of the invention, element levels from Group II, Group III, Group XIII, and rare earth metals can be up to 50 atomic % in the threshold voltage adjustment layer 108. Examples include BaO (50 atomic % barium) and $La_2O_3$ (40 atomic % lanthanum). Undoped $HfO_2$ has 33 atomic % hafnium and element levels in a doped hafnium-containing threshold voltage adjustment layer 108 can, for example, include approximately 28 atomic % hafnium and approximately 3 atomic % lanthanum. In general, a doped hafnium-, zirconium-, or hafnium and zirconium-containing threshold voltage adjustment layer 106 can include any permissible combination of hafnium and/or zirconium with Group II, Group III, Group XIII, and rare earth metals. According to one embodiment, an element level of an element selected from Group II, Group III, Group XIII, and rare earth metals can be less than 20 atomic % in the threshold voltage adjustment layer 108.

Figure 1D:
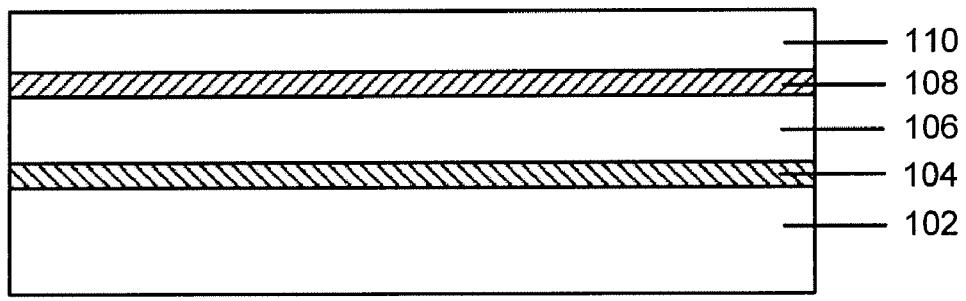

FIG. 1D schematically shows a second high-k film 110 deposited on the threshold voltage adjustment layer 108. The second high-k film 110 can contain hafnium, zirconium, hafnium and zirconium, one or more elements selected from Group II, Group III, Group XIII, rare earth metals of the Periodic Table of the Elements, titanium dioxide ($TiO_2$), or a combination of two or more thereof. The second high-k film 110 can contain $HfO_2$, HfON, HfSiO, HfSiON, $ZrO_2$, ZrON, ZrSiO, ZrSiON, $HfZrO_2$, HfZrON, HfZrSiO, HfZrSiON, or a combination of two or more thereof. A thickness of the second high-k film 110 can, for example, be between about 2 angstrom and about 30 angstrom, or between about 5 angstrom and about 15 angstrom.

The elements and element levels from Group II, Group III, Group XIII, and rare earth metals in the second high-k film 110 may be different from that of the threshold voltage adjustment layer 108. For example, the element levels may be selected to stabilize a particular crystallographic form of the material in the second high-k film 110. Furthermore, the elements and element levels selected for the stabilizing may not be preferred for adjusting the threshold voltage using the threshold voltage adjustment layer 108. In one embodiment, heat treatment can be performed after forming the threshold voltage adjustment layer but before forming the second high-k film. This may provide greater diffusion from the threshold voltage adjustment layer into the first high-k film, and/or may minimize diffusion of elements from the threshold voltage adjustment layer into the second high-k film.

According to embodiments of the invention, each of the first and second high-k films 106, 110, and the threshold voltage adjustment layer 108 can contain hafnium but not zirconium, or alternately, each of the first and second high-k films 106, 110, and the threshold voltage adjustment layer 108 can contain zirconium but not hafnium.

According to embodiments of the invention, a thickness of the first and second high-k films 106, 110, and a thickness of the threshold voltage adjustment layer 108, may be between about 10 angstrom and about 90 angstrom, or between about 12 angstrom and about 50 angstrom. In one example, a thickness of the first high-k film 106 can be between about 2 angstrom and about 15 angstrom, and a thickness of the second high-k film can be about 4 angstrom or greater.

According to one embodiment of the invention, the second high-k film 110 can have a higher dielectric constant than the first high-k film 106. For example, the first high-k film 106 may contain hafnium, zirconium, or hafnium and zirconium, and the second high-k film 110 may contain doped hafnium, doped zirconium, or doped hafnium and zirconium. The second high-k film 110 can be doped with one or more elements from Group II, Group III, Group XIII, rare earth metals from the Periodic Table of the Elements, or a combination of two or more thereof. The use of a higher dielectric constant material in the second high-k film 110 provides means for maintaining or increasing the physical thickness of the high-k gate stack containing first and second high-k films 106, 110 and threshold voltage adjustment layer 108, while scaling the EOT below a level attained by un-doped high-k materials (e.g., $HfO_2$ or $ZrO_2$).

Figure 1E:
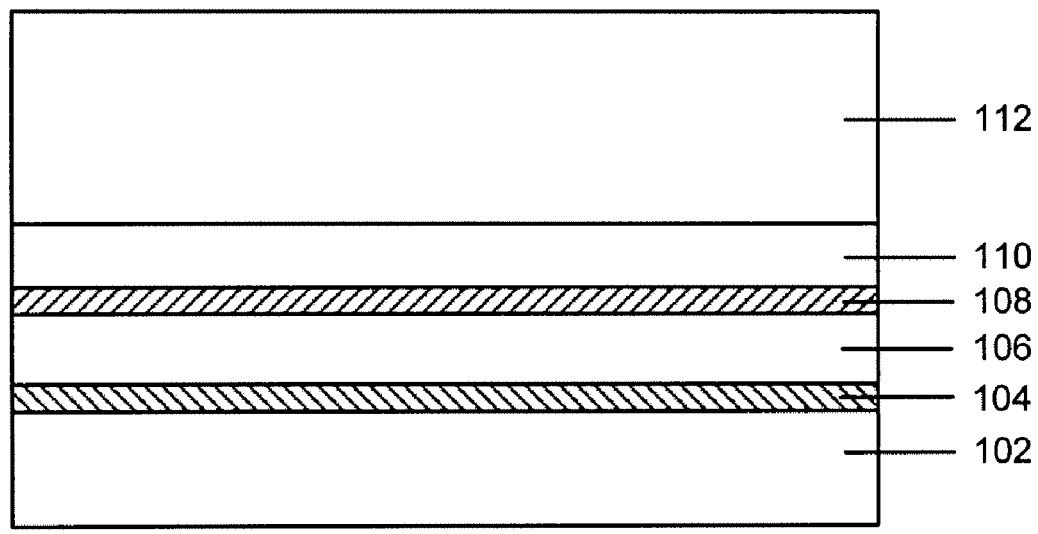

FIG. 1E schematically shows a gate electrode 112 deposited on the second high-k film 110. The gate electrode 112 can, for example, have a thickness between about 5 nm and about 40 nm, or between about 5 nm and about 10 nm and can, for example, contain W, WN, $WSi_x$, Al, Mo, Ta, TaN, TaSiN, HfN, HfSiN, Ti, TiN, TiSiN, Mo, MoN, Re, Pt, or Ru. The gate electrode may further be capped with a polysilicon layer, an oxygen diffusion barrier or both. Representative oxygen diffusion barriers include, but are not limited to amorphous silicon, TiN, TaN, TaSiN, TiSiN and Ru.

Figure 1F:
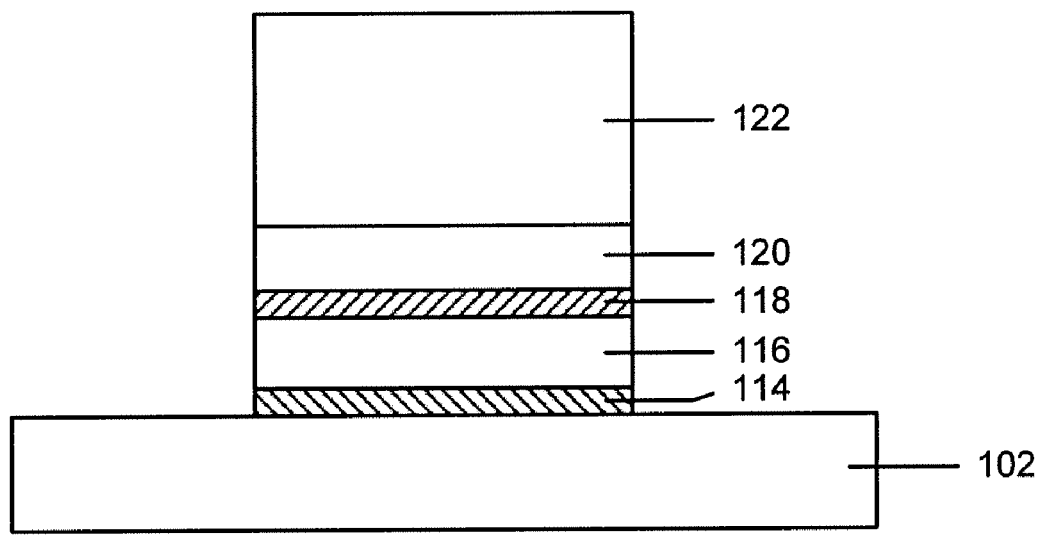

According to an embodiment of the invention, the film structure shown in FIG. 1E is further processed to form a patterned gate stack using standard lithography and etching methods. For example, a photolithography tool may be used to image a pattern onto a photoresist material deposited on the film structure in FIG. 1E. The pattern provides a physical barrier during a subsequent etching process (e.g., a plasma etching process) that selectively removes material not protected by the exposed photoresist. FIG. 1F schematically shows a patterned gate stack containing a patterned interface layer 114, patterned first high-k film 116, a patterned threshold voltage adjustment layer 118, a patterned second high-k film 120, and a patterned gate electrode 122.

Figure 1G:
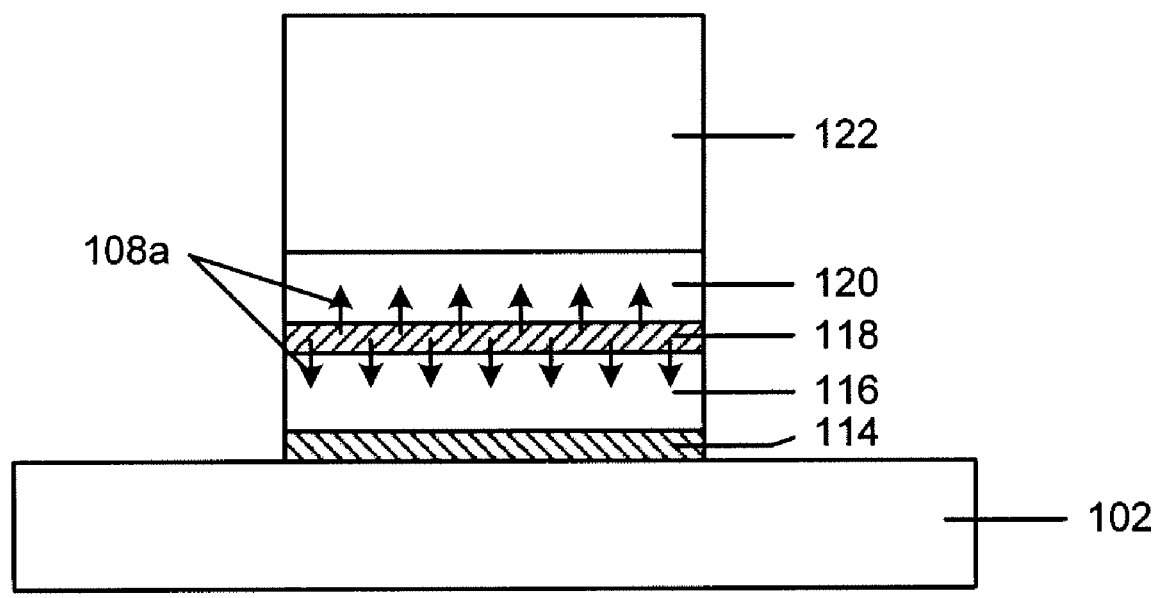

Following formation of the patterned gate stack depicted in FIG. 1F, the patterned gate stack may be heat-treated to control and adjust the work function of the semiconductor device. As schematically depicted in FIG. 1G, the heat-treating diffuses element(s) 108a from patterned threshold voltage adjustment layer 118 into the patterned first high-k film 116 towards the patterned interface layer 114 and the substrate 102, and into the patterned second high-k film 120 towards the patterned gate electrode 122. As those skilled in the art will readily realize, the diffusion may be initiated during deposition of the second high-k film 110 onto the threshold voltage adjustment layer 108 or during subsequent processing steps prior to the heat-treating step.

According to embodiments of the invention, positioning of the patterned threshold voltage adjustment layer 118 between the patterned first and second high-k films 116, 120, allows for lower heat-treating temperatures and shorter processing times compared to approaches where the patterned threshold voltage adjustment layer 118 is positioned above the patterned second high-film 120 and in contact with the patterned gate electrode 122. This is because the diffusing element(s) 108a are not required to diffuse through a full thickness of the high-k gate stack, for example. Furthermore, positioning the patterned threshold voltage adjustment layer 118 between the patterned first and second high-k films 116, 120, and thus closer to the interface layer 104, may enable the use of a patterned threshold voltage adjustment layer 118 containing element(s) 108a with low rates of diffusion in other dielectric materials (i.e., the patterned first and second high-k films 116, 120). This approach of positioning the patterned threshold voltage adjustment layer closer to the interface layer 104 can result in a larger workfunction shift, and may be particularly useful in integration schemes including a replacement gate for which thermal budget considerations are crucial, and good conformality is required. Furthermore, according to embodiment of the invention, a thickness of the threshold voltage adjustment layer 108 may be minimized without affecting the properties of the interface layer 104. Still further, by spacing the patterned threshold voltage adjustment layer 118 from the interface layer 104, the above advantages can be obtained while retaining the high mobility, low defect properties of the interface layer 104. Further, although the semiconductor processing industry generally avoids additional processing steps in the formation of a gate stack, the present inventors realized that forming the threshold voltage adjustment layer interposed between the high-k films provides advantages that warrant the additional processing step necessary to achieve this configuration.

According to embodiments of the invention, one or more of the first high-k film 106, the second high-k film 110, and the threshold voltage adjustment layer 108 may be deposited by atomic layer deposition (ALD), plasma-enhanced ALD (PEALD), chemical vapor deposition (CVD), or plasma-enhanced CVD (PECVD). According to one embodiment of the invention, ALD or PEALD may be utilized due to normally superior uniformity and atomic level thickness control compared to CVD and PECVD methods.

Figure 2:
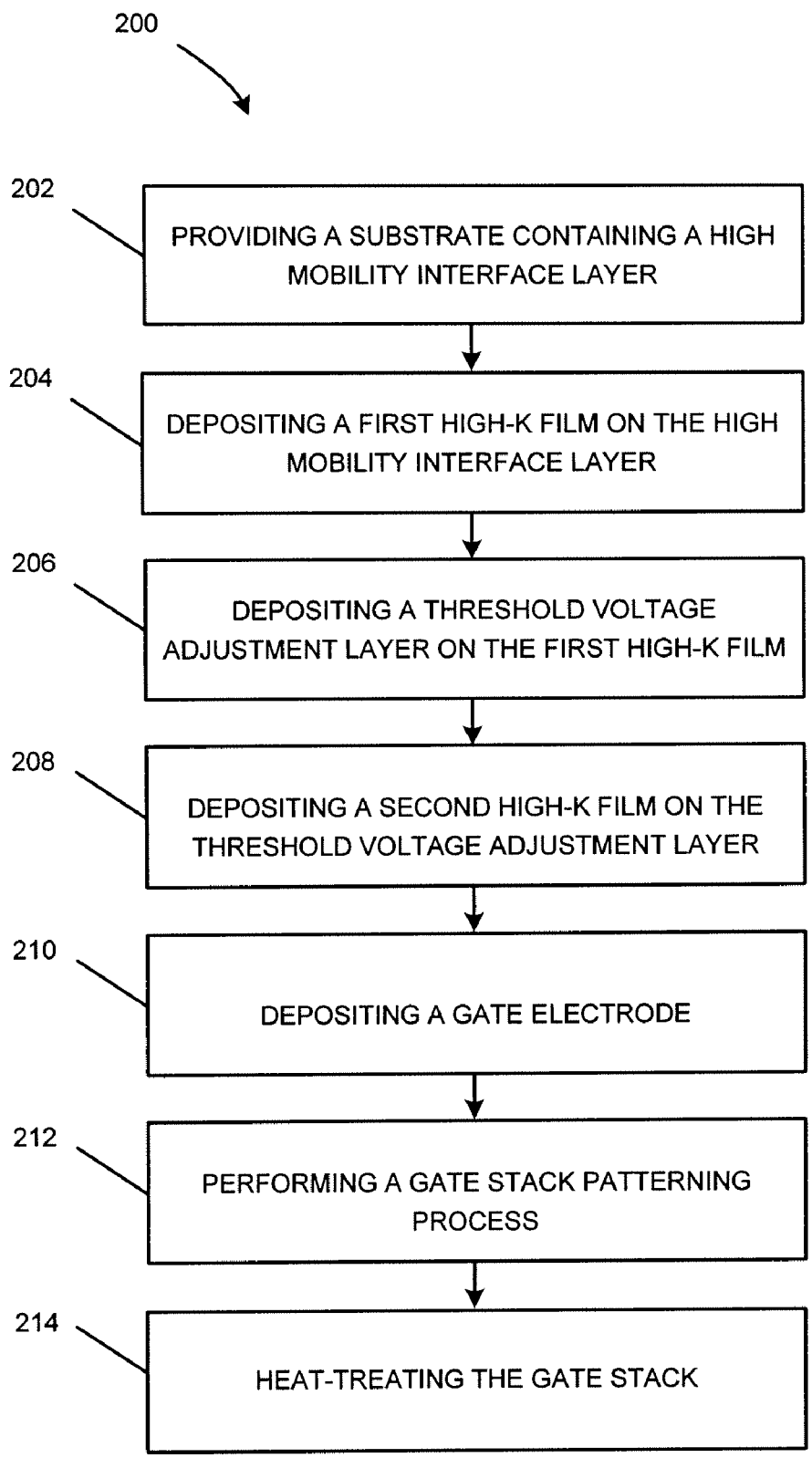
FIG. 2 is a process flow diagram for forming a semiconductor device containing a buried threshold voltage adjustment layer according to an embodiment of the invention.

FIG. 2 is a process flow diagram for forming a semiconductor device containing a buried threshold voltage adjustment layer according to an embodiment of the invention. The processing system 1 of FIG. 4A or the plasma processing system 100 of FIG. 4B may be utilized for depositing a first high-k film, a threshold voltage adjustment layer, and a second high-k film. Alternately, any other processing systems suitable for perform a thin film deposition process may be used.

Referring now to FIGS. 1A-1G, FIG. 2, and FIG. 4A, the process 200 begins in step 202 when substrate 102 is provided in a process chamber 10 of processing system 1. The substrate 102 contains an interface layer 104. Alternately, the interface layer 104 may be formed on the substrate 102 in the process chamber 10. In step 204, a first high-k film 106 is deposited on the interface layer 104, and in step 206, a threshold voltage adjustment layer 108 is deposited on the first high-k film 106. Thereafter, in step 208, a second high-k film 110 is deposited on the threshold voltage adjustment layer 108. In step 210, a gate electrode 112 is deposited on the second high-k film 110. In step 212, a gate stack patterning process is performed to form a patterned gate stack depicted in FIG. 1F. In step 214, the patterned gate stack is heat-treated to diffuse element(s) 108a from the patterned threshold voltage adjustment layer 118 into the patterned first and second high-k films 116, 120. Exemplary heat-treating conditions include temperature between approximately 500° C. and approximately 1100° C. and processing times greater than approximately 15 seconds. The heat-treating allows for adjusting and controlling the work function of a semiconductor device containing the patterned gate stack. In an alternative embodiment, heat treatment may be performed prior to the patterning process to realize the benefits and advantages described herein.

According to another embodiment of the invention, the film structure schematically shown in FIG. 1C may be heat-treated prior to depositing second high-k film 110 on the threshold voltage adjustment layer 108. The heat-treating results in diffusion of elements from the threshold voltage adjustment layer 108 into the first high-k film 106 towards the interface layer 104 and the substrate 102. Since heat-treating is performed before deposition of the second high-k film 110 on the threshold voltage adjustment layer 108, any subsequent heat-treating of the film structures schematically shown in FIG. 1D-1E is expected to result in reduced diffusion of the elements from the threshold voltage adjustment layer 108 into the second high-k film 110 or from the patterned threshold voltage adjustment layer 118 into the patterned second high-k film 120 in FIG. 1F.

According to yet another embodiment of the invention, the film structure schematically shown FIG. 1D may be heat-treated prior to depositing the gate electrode 112 on the second high-k film 110. According to still another embodiment of the invention, the film structure schematically shown FIG. 1E may be heat-treated prior to performing the patterning process depicted in FIG. 1F.

In summary, heat-treating may be performed following deposition of the threshold voltage adjustment layer 108 (FIG. 1C), following deposition of the second high-k film 110 (FIG. 1D), following deposition of the gate electrode 112 (FIG. 1E), or following formation of the patterned gate stack (FIG. 1F), or a combination of two or more thereof.

Figure 3:
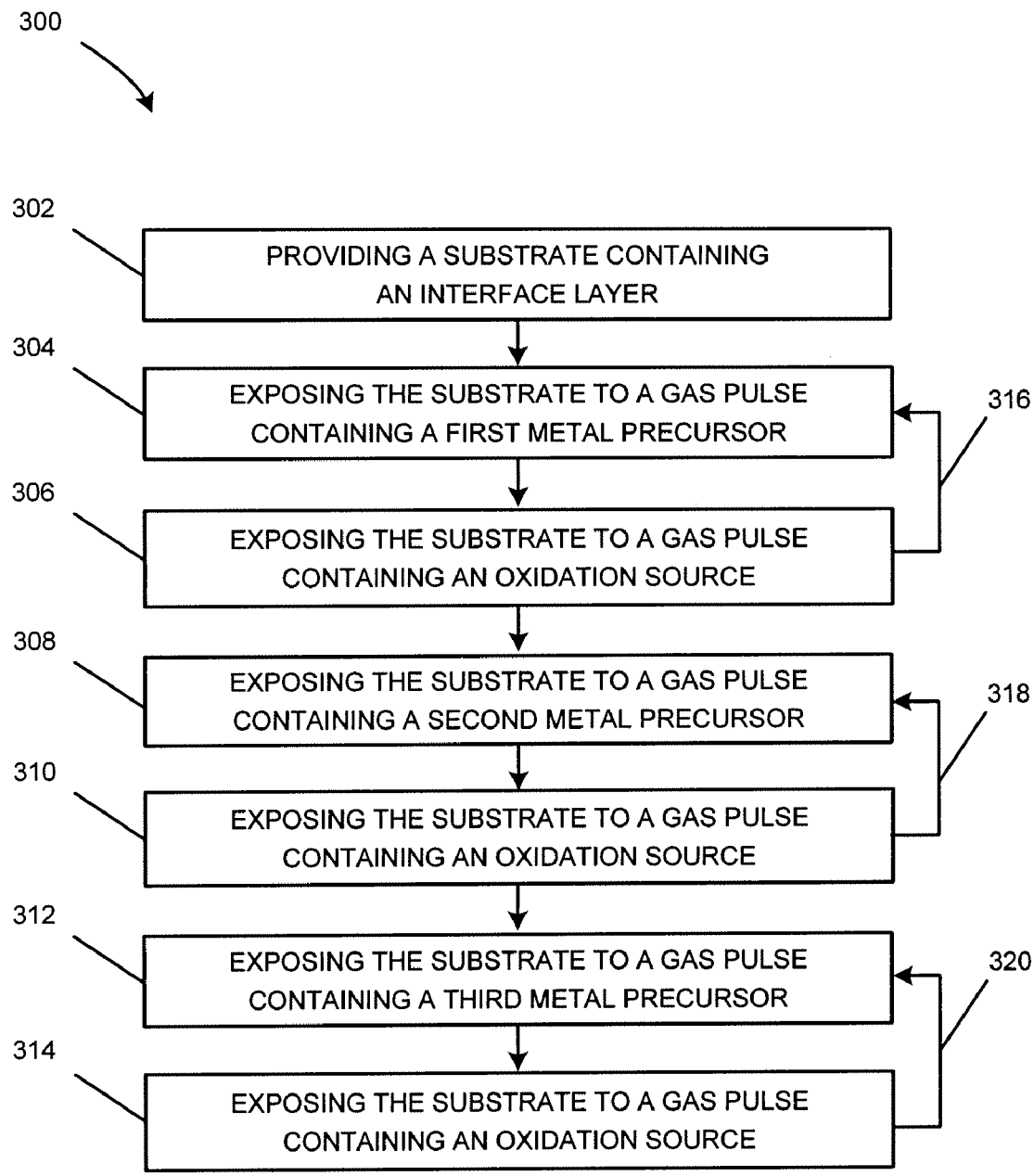
FIG. 3 is a process flow diagram for depositing a high-k material containing a buried threshold voltage adjustment layer according to an embodiment of the invention.

According to one embodiment of the invention, a first high-k film 106, second high-k film 110, and threshold voltage adjustment layer 108 may be deposited in the processing system 1 using ALD. An exemplary ALD process for depositing oxide materials is described in FIG. 3. In step 302, a substrate 102 containing an interface layer 104 is provided in step 302. In step 304, the substrate 102 is exposed to a gas pulse containing a first metal precursor to adsorb a layer less than a monolayer thick of the first metal precursor on the interface layer 104. The chemisorbed layer can be less than a monolayer thick due to the normally large size of the metal precursor compared to the size of the metal element. In step 306, the substrate 102 is exposed to a gas pulse containing an oxidation source that reacts with the adsorbed first metal precursor. The oxidation source can include atomic oxygen (O), $O_2$, ozone, $H_2O$, $H_2O_2$, or a combination thereof, and optionally an inert gas such as Ar. By repeating this sequential gas exposure in steps 304 and 306, as shown by process flow arrow 316, it is possible to achieve layer by layer growth of about 1 angstrom per cycle. Steps 304 and 306 may be repeated any number of times to deposit a first high-k film 106 with a desired thickness on the interface layer 104.

In step 308, the substrate 102 is exposed to a gas containing a second metal precursor to adsorb a layer of the second metal precursor on the substrate 102 and, in step 310, the substrate 102 is exposed to a gas pulse containing an oxidation source that reacts with the adsorbed second metal precursor. As shown by process flow arrow 318, steps 308 and 310 may be repeated any number of times to deposit a threshold voltage adjustment layer 108 with a desired thickness on the first high-k film 106.

In step 312, the substrate 102 is exposed to a gas pulse containing a third metal precursor to adsorb a layer of the third metal precursor on the substrate 102 and, in step 314, the substrate 102 is exposed to a gas pulse containing an oxidation source that reacts with the adsorbed third metal precursor. As shown by process flow arrow 320, steps 312 and 314 may be repeated any number of times to deposit a second high-k film with a desired thickness on the threshold voltage adjustment layer 108. Once the second high-k film is formed, the gate stack may be formed by a patterning process, and the gate stack exposed to heat treatment as described above. Although not shown in FIG. 3, the process chamber may be purged or evacuated to remove any unreacted metal precursor, byproducts, and oxidation source gas from the process chamber between the sequential and alternating gas pulses.

Figure 4A:
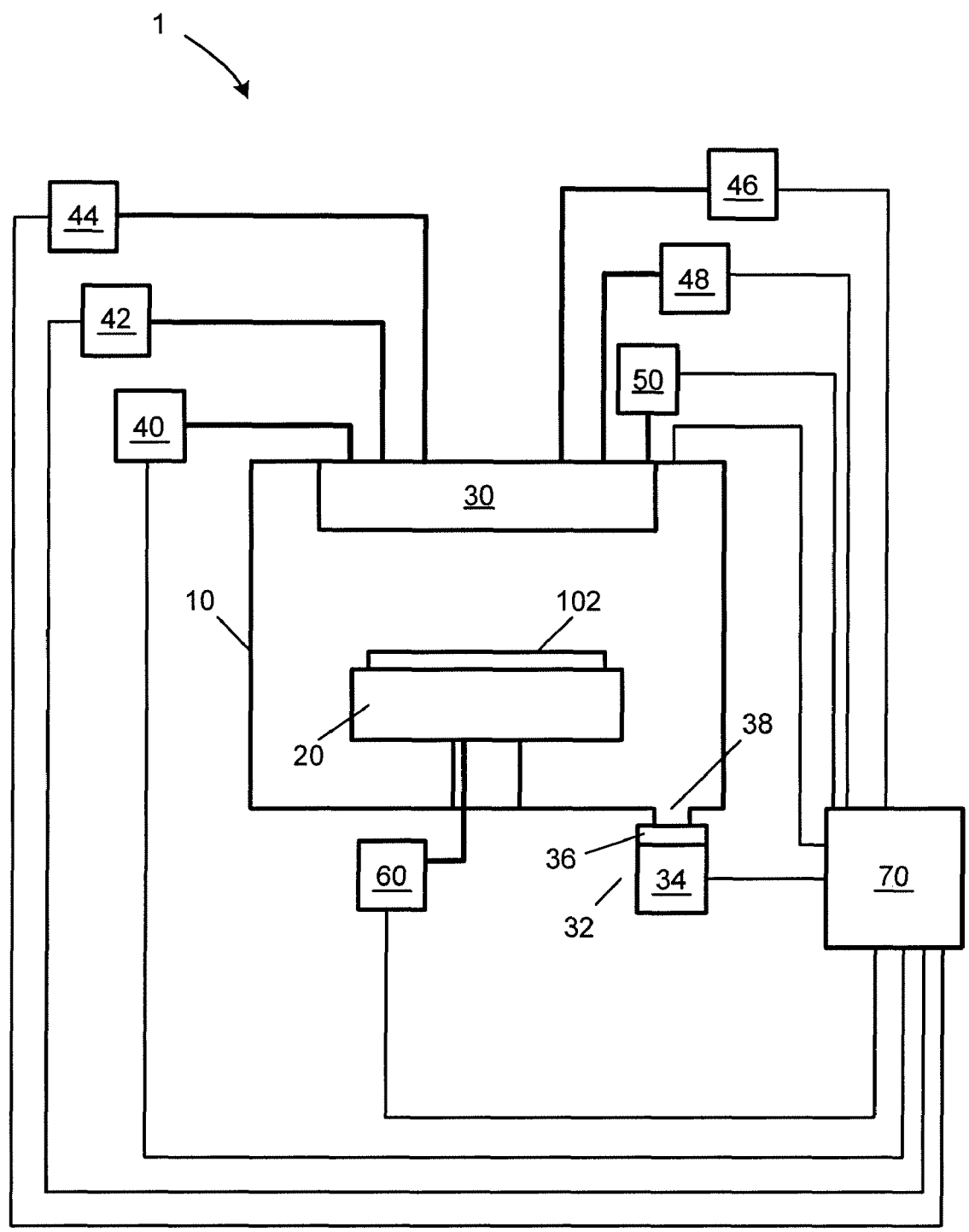
FIGS. 4A and 4B illustrate processing systems for depositing a high-k material on a substrate according to embodiments of the invention.

FIG. 4A illustrates a processing system 1 for depositing first high-k film 106, a second high-k film 110, and threshold voltage adjustment layer 108 on a substrate 102 according to one embodiment of the invention. The processing system 1 may be configured for performing ALD or CVD processing. The processing system 1 includes a process chamber 10 having a substrate holder 20 configured to support a substrate 102, upon which the high-k material is formed. The process chamber 10 further contains an upper assembly 30 (e.g., a showerhead) coupled to a first precursor supply system 40 (e.g., hafnium precursor supply system), a second precursor supply system 42 (e.g., zirconium precursor supply system), a purge gas supply system 44, an oxygen-containing gas supply system 46, a nitrogen-containing gas supply system 48, and an auxiliary gas supply system 50 for supplying one or more elements selected from Group II, Group III, Group XIII, rare earth elements of the Periodic Table of the Elements, or other elements, for example silicon. In addition, the oxygen-containing gas supply system 46 or the nitrogen-containing gas supply system 48 may be configured to supply an oxygen- and nitrogen-containing gas. Additionally, processing system 1 includes a substrate temperature control system 60 coupled to substrate holder 20 and configured to elevate and control the temperature of substrate 102. Furthermore, the processing system 1 includes a controller 70 that can be coupled to process chamber 10, substrate holder 20, upper assembly 30 configured for introducing process gases into the process chamber 10, first precursor supply system 40, second precursor supply system 42, purge gas supply system 44, oxygen-containing gas supply system 46, nitrogen-containing gas supply system 48, auxiliary gas supply system 50, and substrate temperature control system 60.

Alternatively, or in addition, controller 70 can be coupled to one or more additional controllers/computers (not shown), and controller 70 can obtain setup and/or configuration information from an additional controller/computer.

In FIG. 4A, singular processing elements (10, 20, 30, 40, 42, 44, 46, 48, 50, and 60) are shown, but this is not required for the invention. The processing system 1 can include any number of processing elements having any number of controllers associated with them in addition to independent processing elements. The controller 70 can be used to configure any number of processing elements (10, 20, 30, 40, 42, 44, 46, 48, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 4A, the processing system 1 may be configured to process 200 mm substrates, 300 mm substrates, or larger-sized substrates. In fact, it is contemplated that the processing system 1 may be configured to process substrates, wafers, or LCDs regardless of their size, as would be appreciated by those skilled in the art. Therefore, while aspects of the invention will be described in connection with the processing of a semiconductor substrate, the invention is not limited solely thereto. Alternately, a batch processing system capable of processing multiple substrates simultaneously may be utilized for depositing the high-k materials described in the embodiments of the invention.

The first precursor supply system 40 and the second precursor supply system 42 may be configured to alternately or simultaneously introduce a hafnium precursor and a zirconium precursor to process chamber 10. The alternation of the introduction of the hafnium precursor and the zirconium precursor can be cyclical, or it may be acyclical with variable time periods between introduction of the hafnium and zirconium precursors.

According to embodiments of the invention, several methods may be utilized for introducing the first and/or second precursors to the process chamber 10. One method includes vaporizing precursors through the use of separate bubblers or direct liquid injection (DLI) systems, or a combination thereof, and then mixing in the gas phase within or prior to introduction into the process chamber 10. DLI systems have been shown to reduce premature thermal decomposition of precursors over bubbling methods. By controlling the vaporization rate of each precursor separately, a desired stoichiometry can be attained within the deposited film. Another method of delivering the first and second precursors includes separately controlling two or more different liquid sources (neat precursors or precursor solutions), which are then mixed prior to entering a common vaporizer. This method may be utilized when the precursors are compatible in solution or in liquid form and they have similar vaporization characteristics. Yet another method of delivering the first and second precursor includes controlling the flow of a liquid precursor mixture (neat precursors or precursors solutions) to a common vaporizer. Other methods include the use of compatible mixed solid or liquid precursors within a bubbler. Liquid source precursors may include neat liquid precursors, or solid or liquid precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In some cases it may be possible to dissolve one or more compatible solid precursors in one or more compatible liquid precursors. It will be apparent to one skilled in the art that by controlling the relative concentration levels of the first and second precursors within a gas pulse, it is possible to deposit films with desired stoichiometries. In one example, hafnium zirconium based films can contain between 5 and 95 atomic percent zirconium (5%<% Zr/(% Zr+% Hf)<95%), and between 5 and 95 atomic percent hafnium (5%<% Hf/(% Zr+% Hf)<95%).

Embodiments of the invention may utilize a wide variety of hafnium and zirconium precursors. For example, representative examples include: $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), $Hf(NMe_2)_4$ (tetrakis(dimethylamido)hafnium, TDMAH), $Zr(O^tBu)_4$ (zirconium tert-butoxide, ZTB), $Zr(NEt_2)_4$ (tetrakis(diethylamido)zirconium, TDEAZ), $Zr(NMeEt)_4$ (tetrakis(ethylmethylamido)zirconium, TEMAZ), $Zr(NMe_2)_4$ (tetrakis(dimethylamido)zirconium, TDMAZ), $Hf(mmp)_4$, $Zr(mmp)_4$, $HfCl_4$, $ZrCl_4$, $ZrCp_2Me_2$, $Zr(tBuCp)_2Me_2$, and $Zr(NiPr_2)_4$. In one example, the hafnium and zirconium precursors may have the same ligands (e.g., HTB and ZTB), thereby preventing any possible detrimental ligand exchange between the precursors.

Embodiments of the invention may utilize one or more of a wide variety of different elements selected from Group II, Group III, Group XIII, and rare earth metals of the Periodic Table. The elements may be provided using any precursor gases that have sufficient reactivity, thermal stability, and volatility. The precursor gases may be delivered to the process chamber using bubbling or DLI methods described above for hafnium and zirconium precursors.

Embodiments of the inventions may utilize a wide variety of different rare earth precursors. For example, many rare earth precursors have the formula:

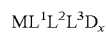

where M is a rare earth metal element selected from the group of yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Examples of L group alkoxides include tert-butoxide, iso-propoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclopentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentandionate, and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6,10-Crown-4, pyridine, N-methylpyrrolidine, triethylamine, trimethylamine, acetonitrile, and 2,2-dimethyl-propionitrile.

Representative examples of rare earth precursors include:

Y precursors: $Y(N(SiMe_3)_2)_3$, $Y(N(iPr)_2)_3$, $Y(N(tBu)SiMe_3)_3$, $Y(TMPD)_3$, $Cp_3Y$, $(MeCp)_3Y$, $((nPr)Cp)_3Y$, $((nBu)Cp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, and $Y(O(iPr))_3$.

La precursors: $La(N(SiMe_3)_2)_3$, $La(N(iPr)_2)_3$, $La(N(tBu)SiMe_3)_3$, $La(TMPD)_3$, $((iPr)Cp)_3La$, $Cp_3La$, $Cp_3La(NCCH_3)_2$, $La(Me_2NC_2H_4CP)_3$, $La(THD)_3$, $La[OOCCH(C_2H_5)C_4H_9]_3$, $La(C_{11}H_{19}O_2)_3 \cdot CH_3(OCH_2CH_2)_3OCH_3$, $La(C_{11}H_{19}O_2)_3 \cdot CH_3(OCH_2CH_2)_4OCH_3$, $La(O(iPr))_3$, $La(OEt)_3$, $La(acac)_3$, $La(((tBu)_2N)_2CMe)_3$, $La(((iPr)_2N)_2CMe)_3$, $La(((tBu)_2N)_2C(tBu))_3$, $La(((iPr)_2N)_2C(tBu))_3$, and $La(FOD)_3$.

Ce precursors: $Ce(N(SiMe_3)_2)_3$, $Ce(N(iPr)_2)_3$, $Ce(N(tBu)SiMe_3)_3$, $Ce(TMPD)_3$, $Ce(FOD)_3$, $((iPr)Cp)_3Ce$, $Cp_3Ce$, $Ce(Me_4\ Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3 \cdot CH_3(OCH_2CH_2)_3OCH_3$, $Ce(C_{11}H_{19}O_2)_3 \cdot CH_3(OCH_2CH_2)_4OCH_3$, $Ce(O(iPr))_3$, and $Ce(acac)_3$.

Pr precursors: $Pr(N(SiMe_3)_2)_3$, $((iPr)Cp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3 \cdot CH_3(OCH_2CH_2)_3OCH_3$, $Pr(O(iPr))_3$, $Pr(acac)_3$, $Pr(hfac)_3$, $Pr(((tBu)_2N)_2CMe)_3$, $Pr(((iPr)_2N)_2CMe)_3$, $Pr(((tBu)_2N)_2C(tBu))_3$, and $Pr(((iPr)_2N)_2C(tBu))_3$.

Nd precursors: $Nd(N(SiMe_3)_2)_3$, $Nd(N(iPr)_2)_3$, $((iPr)Cp)_3Nd$, $Cp_3Nd$, $(C_5Me_4H)_3Nd$, $Nd(THD)_3$, $Nd[OOCCH(C_2H_5)C_4H_9]_3$, $Nd(O(iPr))_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $((iPr)Cp)_3Sm$, $Cp_3Sm$, $Sm(THD)_3$, $Sm[OOCCH(C_2H_5)C_4H_9]_3$, $Sm(O(iPr))_3$, $Sm(acac)_3$, and $(C_5Me_5)_2Sm$.

Eu precursors: $Eu(N(SiMe_3)_2)_3$, $((iPr)Cp)_3Eu$, $Cp_3Eu$, $(Me_4\ Cp)_3Eu$, $Eu(THD)_3$, $Eu[OOCCH(C_2H_5)C_4H_9]_3$, $Eu(O(iPr))_3$, $Eu(acac)_3$, and $(C_5Me_5)_2Eu$.

Gd precursors: $Gd(N(SiMe_3)_2)_3$, $((iPr)Cp)_3Gd$, $Cp_3Gd$, $Gd(THD)_3$, $Gd[OOCCH(C_2H_5)C_4H_9]_3$, $Gd(O(iPr))_3$, and $Gd(acac)_3$.

Tb precursors: $Tb(N(SiMe_3)_2)_3$, $((iPr)Cp)_3Tb$, $Cp_3Tb$, $Tb(THD)_3$, $Tb[OOCCH(C_2H_5)C_4H_9]_3$, $Tb(O(iPr))_3$, and $Tb(acac)_3$.

Dy precursors: $Dy(N(SiMe_3)_2)_3$, $((iPr)Cp)_3Dy$, $Cp_3Dy$, $Dy(THD)_3$, $Dy[OOCCH(C_2H_5)C_4H_9]_3$, $Dy(O(iPr))_3$, $Dy(O_2C(CH_2)_6CH_3)_3$, and $Dy(acac)_3$.

Ho precursors: $Ho(N(SiMe_3)_2)_3$, $((iPr)Cp)_3Ho$, $Cp_3Ho$, $Ho(THD)_3$, $Ho[OOCCH(C_2H_5)C_4H_9]_3$, $Ho(O(iPr))_3$, and $Ho(acac)_3$.

Er precursors: $Er(N(SiMe_3)_2)_3$, $((iPr)Cp)_3Er$, $((nBu)Cp)_3Er$, $Cp_3Er$, $Er(THD)_3$, $Er[OOCCH(C_2H_5)C_4H_9]_3$, $Er(O(iPr))_3$, and $Er(acac)_3$.

Tm precursors: $Tm(N(SiMe_3)_2)_3$, $((iPr)Cp)_3Tm$, $Cp_3Tm$, $Tm(THD)_3$, $Tm[OOCCH(C_2H_5)C_4H_9]_3$, $Tm(O(iPr))_3$, and $Tm(acac)_3$.

Yb precursors: $Yb(N(SiMe_3)_2)_3$, $Yb(N(iPr)_2)_3$, $((iPr)Cp)_3Yb$, $Cp_3Yb$, $Yb(THD)_3$, $Yb[OOCCH(C_2H_5)C_4H_9]_3$, $Yb(O(iPr))_3$, $Yb(acac)_3$, $(C_5Me_5)_2Yb$, $Yb(hfac)_3$, and $Yb(FOD)_3$.

Lu precursors: $Lu(N(SiMe_3)_2)_3$, $((iPr)Cp)_3Lu$, $Cp_3Lu$, $Lu(THD)_3$, $Lu[OOCCH(C_2H_5)C_4H_9]_3$, $Lu(O(iPr))_3$, and $Lu(acac)_3$.

In the above precursors, as well as precursors set forth below, the following common abbreviations are used: Si: silicon; Me: methyl; Et: ethyl; iPr: isopropyl; nPr: n-propyl; Bu: butyl; nBu: n-butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

Still referring to FIG. 4A, the oxygen-containing gas supply system 46 is configured to introduce an oxygen-containing gas to the process chamber 10. The oxygen-containing gas can include, but is not limited to, $O_2$, water ($H_2O$), or peroxide ($H_2O_2$), or a combination thereof, and optionally an inert gas such as Ar. Similarly, the nitrogen-containing gas supply system 48 is configured to introduce a nitrogen-containing gas to the process chamber 10. Examples of nitrogen-containing gases include, but are not limited to, ammonia ($NH_3$), hydrazine ($N_2H_4$), and $C_1$-$C_{10}$ alkylhydrazine compounds. Common $C_1$ and $C_2$ alkylhydrazine compounds include monomethyl-hydrazine ($MeNHNH_2$), 1,1-dimethyl-hydrazine ($Me_2NNH_2$), and 1,2-dimethyl-hydrazine (MeNHNHMe). According to one embodiment of the invention, an oxygen- and nitrogen-containing gas may be utilized, for example, NO, $NO_2$, or $N_2O$, or a combination thereof, and optionally an inert gas such as Ar.

Embodiments of the inventions may utilize a wide variety of different Group II (alkaline earth) precursors. For example, many Group II precursors have the formula:

where M is an alkaline earth metal element selected from the group of beryllium (Be), magnesium (Mg), calcium (Ca), strontium (Sr), and barium (Ba). $L^1$ and $L^2$ are individual anionic ligands, and D is a neutral donor ligand where x can be 0, 1, 2, or 3. Each $L^1$, $L^2$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Examples of L group alkoxides include tert-butoxide, isopropoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclepentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis (trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentanedionate (hfac), and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6,10-Crown-4, pyridine, N-methylpyrrolidine, triethylamine, trimethylamine, acetonitrile, and 2,2-dimethylpropionitrile.

Representative examples of Group II (alkaline earth) precursors include:

Be precursors: $Be(N(SiMe_3)_2)_2Be(TMPD)_2$, and $BeEt_2$.

Mg precursors: $Mg(N(SiMe_3)_2)_2$, $Mg(TMPD)_2$, $Mg(PrCp)_2$, $Mg(EtCp)_2$, and $MgCp_2$.

Ca precursors: $Ca(N(SiMe_3)_2)_2$, $Ca(iPr_4Cp)_2$, and $Ca(Me_5Cp)_2$.

Sr precursors: Bis(tert-butylacetamidinato)strontium (TBAASr), $Sr(N(SiMe_3)_2)_2$, $Sr(THD)_2$, $Sr(THD)_2(tetraglyme)$, $Sr(iPr_4Cp)_2$, $Sr(iPr_3Cp)_2$, and $Sr(Me_5Cp)_2$.

Ba precursors: Bis(tert-butylacetamidinato)barium (TBAABa), $Ba(N(SiMe_3)_2)_2$, $Ba(THD)_2$, $Ba(THD)_2(tetraglyme)$, $Ba(iPr_4Cp)_2$, $Ba(Me_5Cp)_2$, and $Ba(nPrMe_4CP)_2$.

Embodiments of the inventions may utilize a wide variety of different precursors for Group XIII high-k forming elements (B, Al, Ga, In, Tl) into the hafnium zirconium based films. For example, many Al precursors have the formula:

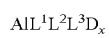

where $L^1$, $L^2$, $L^3$ are individual anionic ligands, and D is a neutral donor ligand where x can be 0, 1, or 2. Each $L^1, L^2, L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Other examples of Al precursors include: $Al_2Me_6$, $Al_2Et_6$, $[Al(O(sBu))_3]_4$, $Al(CH_3COCHCOCH_3)_3$, $AlBr_3$, $AlI_3$, $Al(O$ (iPr))$_3$, $[Al(NMe_2)_3]_2$, $Al(iBu)_2Cl$, $Al(iBu)_3$, $Al(iBu)_2H$, $AlEt_2Cl$, $Et_3Al_2(O(sBu))_3$, and $Al(THD)_3$.

Examples of Ga precursors include $GaCl_3$ and $GaH_3$, examples of In precursors include $InCl_3$ and $InH_3$, and examples of B precursors include borane ($BH_3$), diborane ($B_2H_6$), tri-ethylboron ($BEt_3$), triphenylboron ($BPh_3$), and borane adducts such as $Me_3N:BH_3$, and $BCl_3$.

Embodiments of the invention may utilize a wide variety of silicon precursors for incorporating silicon into the hafnium zirconium based films. Examples of silicon precursors include, but are not limited to, silane ($SiH_4$), disilane ($Si_2H_6$), monochlorosilane ($SiClH_3$), dichlorosilane ($SiH_2Cl_2$), trichlorosilane ($SiHCl_3$), hexachlorodisilane ($Si_2Cl_6$), diethylsilane ($Et_2SiH_2$), and alkylaminosilane compounds. Examples of alkylaminosilane compounds include, but are not limited to, di-isopropylaminosilane ($H_3Si(NPr_2)$), bis (tert-butylamino)silane (($C_4H_9(H)N)_2SiH_2$), tetrakis(dimethylamino)silane ($Si(NMe_2)_4$), tetrakis(ethylmethylamino) silane ($Si(NEtMe)_4$), tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), and tris(dimethylhydrazino)silane ($HSi(N(H)NMe_2)_3$), bis(diethylamino)silane ($H_2Si(NEt_2)_2$), bis(diisopropylamino)silane ($H_2Si(NPr_2)_2$), tris(isopropylamino) silane ($HSi(NPr_2)_3$), and (di-isopropylamino)silane ($H_3Si(NPr_2)$).

Still referring to FIG. 4A, the purge gas supply system 44 is configured to introduce a purge gas to process chamber 10. For example, the introduction of purge gas may occur between introduction of pulses of first and second precursors and an oxygen-containing gas, a nitrogen-containing gas, an oxygen- and a nitrogen-containing gas, or a high-k forming gas to the process chamber 10. The purge gas can contain an inert gas, such as a noble gas (i.e., He, Ne, Ar, Kr, Xe), nitrogen ($N_2$), or hydrogen ($H_2$).

Furthermore, processing system 1 includes substrate temperature control system 60 coupled to the substrate holder 20 and configured to elevate and control the temperature of substrate 102. Substrate temperature control system 60 contains temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the process chamber 10 and any other component within the processing system 1. The substrate temperature control system 60 can, for example, be configured to elevate and control the substrate temperature from room temperature to approximately 350° C. to 550° C. Alternatively, the substrate temperature can, for example, range from approximately 150° C. to 350° C. It is to be understood, however, that the temperature of the substrate is selected based on the desired temperature for causing deposition of a particular dielectric material on the surface of a given substrate.

In order to improve the thermal transfer between substrate 102 and substrate holder 20, substrate holder 20 can include a mechanical clamping system, or an electrical clamping system, such as an electrostatic clamping system, to affix substrate 102 to an upper surface of substrate holder 20. Furthermore, substrate holder 20 can further include a substrate backside gas delivery system configured to introduce gas to the back-side of substrate 102 in order to improve the gas-gap thermal conductance between substrate 102 and substrate holder 20. Such a system can be utilized when temperature control of the substrate is required at elevated or reduced temperatures. For example, the substrate backside gas system can contain a two-zone gas distribution system, wherein the helium gas gap pressure can be independently varied between the center and the edge of substrate 102.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 102, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the process chamber 10. The pressure control system 32 can, for example, be configured to control the process chamber pressure between about 0.1 Torr and about 100 Torr during deposition of the high-k materials.

The first precursor supply system 40, second precursor supply system 42, purge gas supply system 44, oxygen-containing gas supply system 46, the nitrogen-containing gas supply system 48, and auxiliary gas supply system 50 can include one or more pressure control devices, one or more flow control devices, one or more filters, one or more valves, and/or one or more flow sensors. The flow control devices can include pneumatic driven valves, electro-mechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 1 sec and about 10 sec. Exemplary gas pulse lengths for precursor gases can be between 0.3 and 3 sec, for example 1 sec. Exemplary gas pulse lengths for an oxygen-containing gas, a nitrogen-containing gas, and an oxygen- and nitrogen-containing gas can be between 0.3 and 3 sec, for example 1 sec. Exemplary purge gas pulses can be between 1 and 20 sec, for example 3 sec. An exemplary pulsed gas injection system is described in greater detail in pending U.S. Patent Application Publication No. 2004/0123803.

Still referring to FIG. 4A, controller 70 can contain a microprocessor, memory, and a digital I/O port capable of generating control voltages sufficient to communicate and activate inputs to the processing system 1 as well as monitor outputs from the processing system 1. Moreover, the controller 70 may be coupled to and may exchange information with the process chamber 10, substrate holder 20, upper assembly 30, first precursor supply system 40, second precursor supply system 42, purge gas supply system 44, oxygen-containing gas supply system 46, nitrogen-containing gas supply system 48, auxiliary gas supply system 50, substrate temperature control system 60, substrate temperature control system 60, and pressure control system 32. For example, a program stored in the memory may be utilized to activate the inputs to the aforementioned components of the deposition system 1 according to a process recipe in order to perform a deposition process.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 via a wireless connection.

Figure 4B:
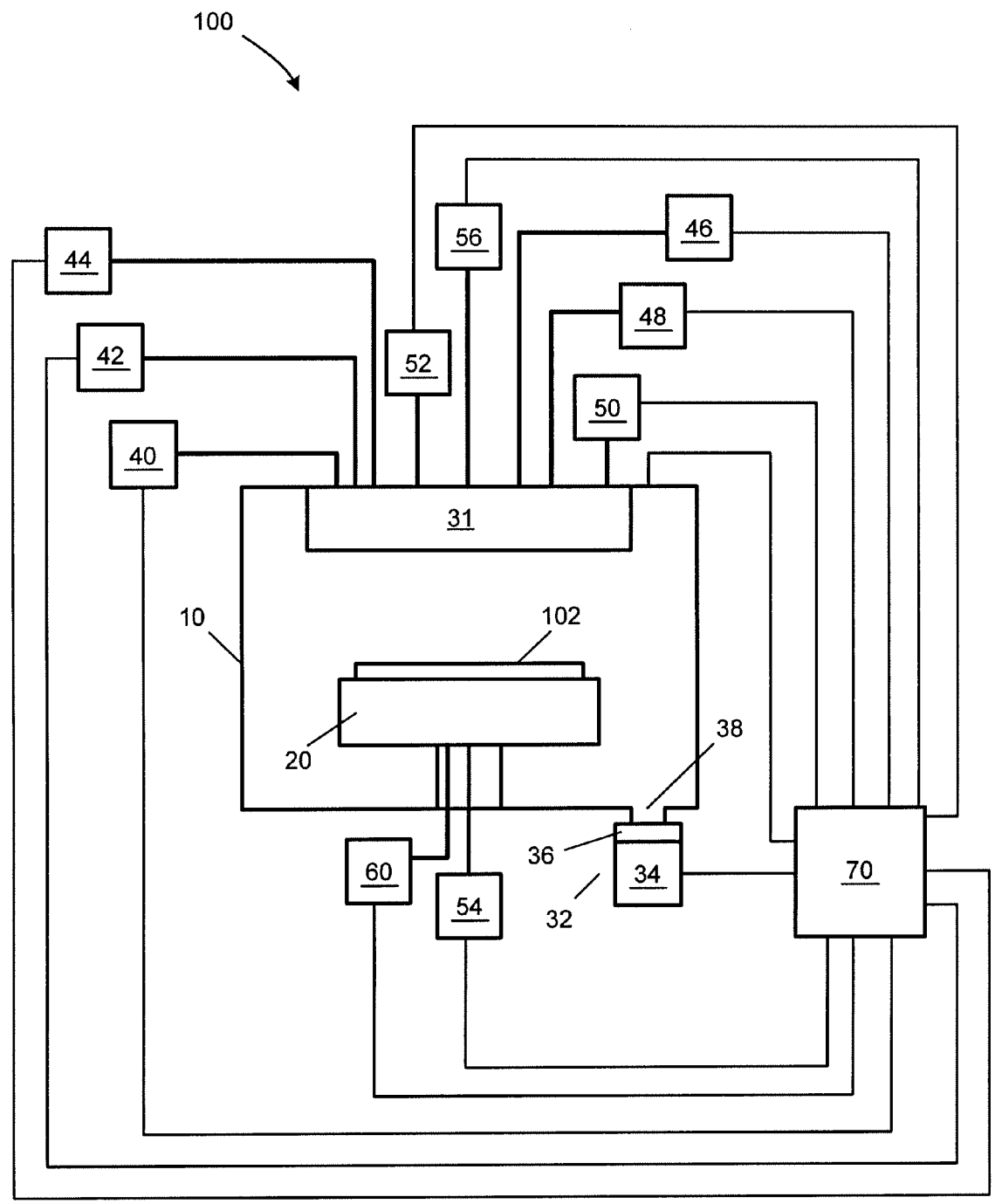

FIG. 4B illustrates a plasma processing system 100 for depositing first high-k film 106, a second high-k film 110, and threshold voltage adjustment layer 108 on a substrate 102 according to another embodiment of the invention. The plasma processing system 100 may be configured for performing PEALD or PECVD processing, in addition being able to perform ALD or CVD processing. The plasma processing system 100 is similar to the processing system 1 described in FIG. 4A, but further includes a plasma generation system configured to generate a plasma during at least a portion of the gas exposures in the process chamber 10. This allows formation of ozone and plasma excited oxygen from an oxygen-containing gas containing $O_2$, $H_2O$, $H_2O_2$, or a combination thereof. Similarly, plasma excited nitrogen may be formed from a nitrogen-containing gas containing $N_2$, $NH_3$, or $N_2H_4$, or $C_1$-$C_{10}$ alkylhydrazine compounds, or a combination thereof.

Also, plasma excited oxygen and nitrogen may be formed from a process gas containing NO, $NO_2$, and $N_2O$, or a combination thereof. The plasma generation system includes a first power source 52 coupled to the process chamber 10, and configured to couple power to gases introduced into the process chamber 10. The first power source 52 may be a variable power source and may include a radio frequency (RF) generator and an impedance match network, and may further include an electrode through which RF power is coupled to the plasma in process chamber 10. The electrode can be formed in the upper assembly 31, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art.

Alternatively, the first power source 52 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 52 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, the entire content of which is incorporated herein by reference.

According to one embodiment of the invention, the plasma processing system 100 includes a substrate bias generation system configured to generate or assist in generating a plasma (through substrate holder biasing) during at least a portion of the alternating introduction of the gases to the process chamber 10. The substrate bias system can include a substrate power source 54 coupled to the process chamber 10, and configured to couple power to the substrate 102. The substrate power source 54 may include a RF generator and an impedance match network, and may further include an electrode through which RF power is coupled to substrate 102. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 4B as separate entities, they may indeed contain one or more power sources coupled to substrate holder 20.

In addition, the plasma processing system 100 includes a remote plasma system 56 for providing and remotely plasma exciting an oxygen-containing gas, a nitrogen-containing gas, or a combination thereof, prior to flowing the plasma excited gas into the process chamber 10 where it is exposed to the substrate 102. The remote plasma system 56 can, for example, contain a microwave frequency generator. The process chamber pressure can be between about 0.1 Torr and about 10 Torr, or between about 0.2 Torr and about 3 Torr.

A plurality of embodiments for forming a semiconductor device containing a buried threshold voltage adjustment layer have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, the method comprising:

providing a substrate containing an interface layer thereon;

depositing a first high-k film on the interface layer, the first high-k film comprising hafnium oxide, zirconium oxide, hafnium silicate, or zirconium silicate, or a combination of two or more thereof;

depositing a metal-containing oxide threshold voltage adjustment layer on the first high-k film, the metal-containing oxide threshold voltage adjustment layer comprising lanthanum oxide, magnesium oxide, or aluminum oxide, or a combination of two or more thereof;

depositing a second high-k film on the metal-containing oxide threshold voltage adjustment layer, wherein the metal-containing oxide threshold voltage adjustment layer is interposed between the first and second high-k films; and performing a heat-treating process following deposition of the metal-containing oxide threshold voltage adjustment layer, following deposition of the second high-k film, following deposition of a gate electrode, or following formation of a gate stack, wherein the performing the heat-treating process includes performing the heat-treating process to diffuse elements of the metal-containing oxide threshold voltage adjustment layer into the first high-k film on the interface layer.

2. The method of claim 1, wherein the second high-k film comprises hafnium oxide, hafnium silicate, zirconium oxide, or zirconium silicate, or a combination of two or more thereof.

3. The method of claim 1, wherein the second high-k film has a higher dielectric constant than the first high-k film.

* * * * *